United States Patent
Eisenhardt et al.

(10) Patent No.: US 6,348,672 B2
(45) Date of Patent: Feb. 19, 2002

(54) ELECTRIC HEATER FOR A MOTOR VEHICLE WITH INDIVIDUALLY SWITCHED BRANCH CIRCUITS

(75) Inventors: Harald Eisenhardt, Rutesheim; Rolf Falliano, Steinenberg, both of (DE)

(73) Assignee: GKR Gesellschaft fur Fahrzeugklimaregelung mbH, Schwieberdingen (DE)

( * ) Notice: Subject to any disclaimer, the term of this patent is extended or adjusted under 35 U.S.C. 154(b) by 0 days.

(21) Appl. No.: 09/269,679
(22) PCT Filed: Jul. 13, 1998
(86) PCT No.: PCT/DE98/01948
   § 371 Date: Jun. 9, 1999
   § 102(e) Date: Jun. 9, 1999
(87) PCT Pub. No.: WO99/07185
   PCT Pub. Date: Feb. 11, 1999

(30) Foreign Application Priority Data

Jul. 31, 1997 (DE) .......................... 197 33 045

(51) Int. Cl.$^7$ ................................. H05B 3/14
(52) U.S. Cl. .................. 219/202; 219/209; 219/476
(58) Field of Search ................. 219/202, 209, 219/476, 480, 508, 483, 497, 501, 477

(56) References Cited

U.S. PATENT DOCUMENTS

| | | | | |
|---|---|---|---|---|
| 3,139,515 A | * | 6/1964 | Leigh et al. | 219/476 |
| 3,801,278 A | * | 4/1974 | Wagner et al. | 219/478 |
| 4,216,371 A | * | 8/1980 | Marotel | 219/501 |
| 4,336,444 A | * | 6/1982 | Bice et al. | 219/505 |
| 5,320,030 A | * | 6/1994 | Hubbard | 219/477 |

FOREIGN PATENT DOCUMENTS

| | | | |
|---|---|---|---|
| DE | 3045327 | * | 7/1982 |
| DE | 34 42 350 | | 6/1986 |
| EP | 134 985 | | 3/1985 |
| EP | 564 027 | | 10/1993 |

\* cited by examiner

*Primary Examiner*—John A. Jeffery
(74) *Attorney, Agent, or Firm*—Kenyon & Kenyon

(57) ABSTRACT

An electric heater for a motor vehicle uses heat generated by power semiconductors as the heat source. The heat output by the power semiconductors is used directly for heating. The power semiconductors are regulated by circuit regulators to be able to adjust the heating power continuously. In addition, switching devices are provided which interrupt or shut down the respective branch circuits individually in the event of short circuits in the power semiconductors.

23 Claims, 3 Drawing Sheets

ELECTRIC HEATER FOR A MOTOR VEHICLE WITH INDIVIDUALLY SWITCHED BRANCH CIRCUITS

FIELD OF THE INVENTION

The present invention relates to an electric heater for a motor vehicle, using the heat generated by power semiconductors as the heat source.

BACKGROUND INFORMATION

Such a heater is described in German Patent No. 34 42 350. With this known heater, the power semiconductor controls the electric drive motor. The power semiconductor is connected to a cooling body through which a liquid coolant flows, so the heat generated is transferred to the liquid coolant by heat exchange. The liquid coolant circulates in a closed line system having a pump and the actual heater installation.

The efficiency of this known electric heater is not especially great, because the heat generated by the power semiconductor must be converted repeatedly. In addition, the heater installation has a complicated design, depends on the engine current present and thus cannot be regulated independently of the latter.

SUMMARY OF THE INVENTION

The object of the present invention is to create an electric heater, where the efficiency is greatly increased with a simple design and independent regulation of heating power is possible.

This object is achieved according to a first embodiment of the present invention by connecting several branch circuits, each with one power semiconductor operated in high power loss operation, in parallel for generation of heat, or according to a second embodiment by connecting several branch circuits, each with two series-connected power semiconductors operated in high power loss operation, in parallel for generation of heat.

In these embodiments, the current is converted directly into heat by the power semiconductors, which greatly increases efficiency. Another advantage of the new heater is that no additional control module is needed for the heater. Installation of the heater in the motor vehicle is also greatly simplified. In addition, the cabling complexity and manufacturing costs of the new electric heater are also reduced.

No separate fuse protection for the heater in the vehicle electrical system is necessary. When starting operation of the heater, the high starting current surge can be prevented by a regulated smooth current rise. The new heating module can be cascaded in any desired fashion to increase the heating power and can also be integrated easily into a fan regulator.

To protect the power semiconductors, one embodiment provides for a switching device that responds to overload to be connected in series with the power semiconductor in each branch circuit. In the event of a fault, the branch circuit affected can be shut down with this switching device without having to lose heater function as a whole. Heating power is reduced only by the ratio of defective branch circuits to total branch circuits.

According to another embodiment, regulation of the heating power is easily made possible by the fact that the power output by the power semiconductors can be regulated individually by a common predetermined setpoint and by actual values derived from the power semiconductors, or by the fact that the powers output by the respective first power semiconductors of the branch circuits can be regulated individually by a common predetermined setpoint and by actual values derived at these power semiconductors, and the powers output by the respective second power semiconductors can be regulated individually by a fixed predetermined control voltage and by actual values derived at these power semiconductors.

If the branch circuits are to supply power at the output to a low-resistance series resistor as a load impedance, then the heat generated by the series resistor can contribute to an increase in heating power. Each power semiconductor can supply power to an individual series resistor. All the power semiconductors may also supply power to a common series resistor, or groups of power semiconductors may each be connected to a group-individual series resistor.

The switching devices for interrupting the branch circuits can be implemented in various ways. Thus, according to one embodiment, the switching devices may be designed as a printed conductor part of the branch circuits which burn out in the event of a fault at the elevated current occurring in the respective branch circuit. The same effect can also be achieved by looping the switching devices as shunts into the branch circuits, which burn out in the event of a fault at the elevated current occurring in the respective branch circuit, in which case the shunt can also be used to derive another control signal. The branch circuit can also be interrupted by using the connecting wires of the power semiconductors which burn out in the event of a fault at the elevated current occurring in the respective branch circuit.

A controlled reduction or interruption in the current in a defective branch circuit occurs when measures are taken to ensure that in the event of a short circuit in one of the two power semiconductors connected in series in a branch circuit, an additional control signal can be derived from the defective branch circuit to reduce the power output by the respective second power semiconductor or switching it to a disconnect status. The control signal picked off at the shunt can be used as the control signal.

The structural design of the new electric heater can be simplified by designing it as a heater module, with the power semiconductors mounted in thermal contact on a cooling body, with the heat transfer via the cooling body being improved.

Simple temperature monitoring can be achieved with the electric heater by the fact that the power semiconductors and/or the cooling body are monitored by temperature sensors to detect whether a predetermined maximum temperature is exceeded, and by the fact that the output signals of the temperature sensor(s) reduce the power output by the respective power semiconductors or all the power semiconductors or switch them to a disconnect status. If the power semiconductors are monitored by individual temperature sensors, the expense of this is reduced by integrating the temperature sensors into the power semiconductors.

DETAILED DESCRIPTION

Figure 1:
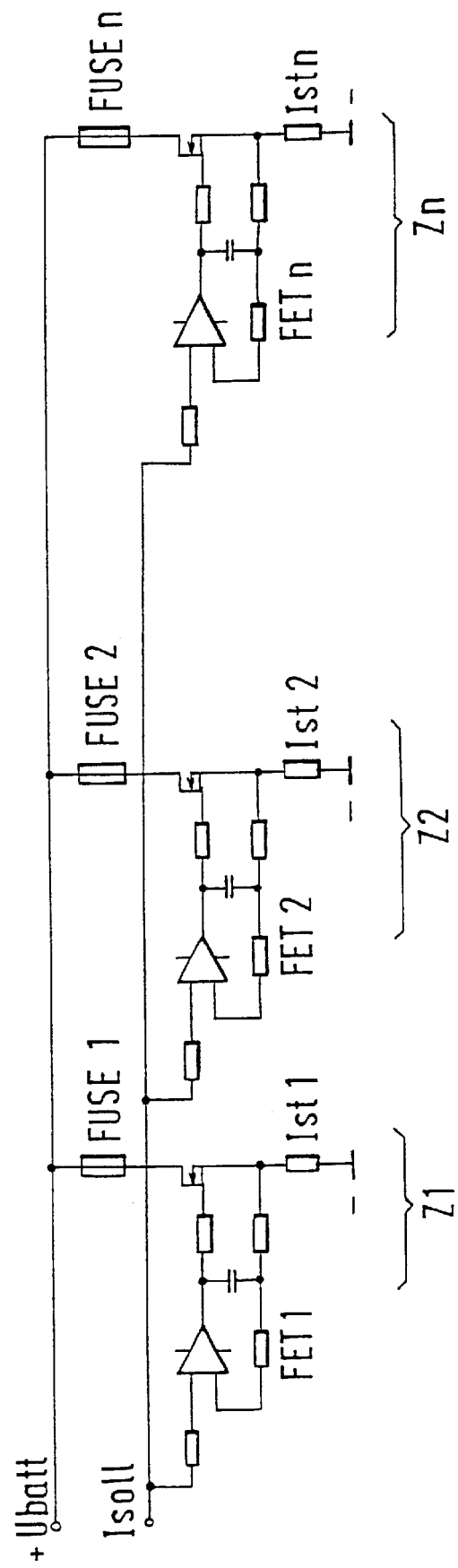
FIG. 1 shows a circuit diagram of a first embodiment of an electric heater with n parallel branch circuits, each containing one power semiconductor.

As FIG. 1 shows, branch circuits Z1, Z2, . . . Zn are connected in parallel to one another at power supply voltage Ubatt, with each branch circuit Z1, Z2, . . . , Zn having a power semiconductor FET1, FET2, . . . , FETn. The connection to power supply voltage Ubatt is by way of switching devices FUSE1, FUSE2, . . . , FUSEn, which perform an individual interruption of branch circuit Z1, Z2, . . . , Zn in the event of a fault, e.g., a short circuit of the power semiconductor at which the multiple current occurs. A shunt which is not shown in detail may be added to the connection of power semiconductors FET1, FET2, . . . , FETn at the ground potential, where an individual actual value Istl, Ist2, . . . Istn can be derived for the branch circuit Z1, Z2, . . . , Zn. In addition to the actual value detected at the shunt, a setpoint Isoll is supplied to the gate terminal of power semiconductors FET1, FET2, . . . , FETn via a comparator or operational amplifier that serves as a circuit regulator to permit continuous regulation of the power in the respective power semiconductor. If the actual value exceeds setpoint Isoll, then the circuit regulator switches the power semiconductor into the disconnect status or reduces the power output. In addition, switching device FUSE1, FUSE2, . . . , FUSEn can completely interrupt branch circuit Z1, Z2, . . . , Zn in the event of a short circuit of respective power semiconductor FET1, FET2, . . . , FETn.

Figure 3:
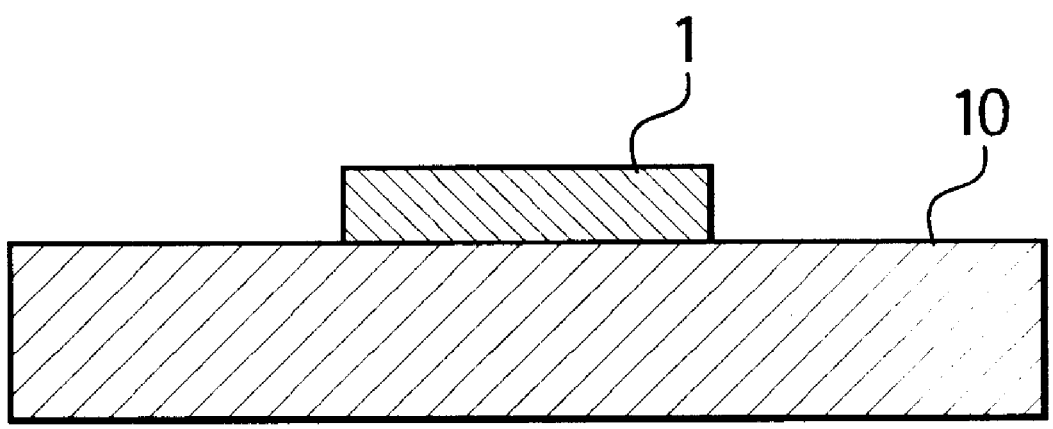
FIG. 3 is a cross-sectional view showing power semiconductors mounted on a cooling body in accordance with the present invention.

Printed conductor segments of branch circuit Z1, Z2 . . . . , Zn themselves can be used as switching devices FUSE1, FUSE2 . . . . , FUSEn. Depending on the design of branch circuits Z1, Z2, . . . , Zn and the respective circuit regulator, the current may increase to a level 25 to 50 times higher in the event of a short circuit, so the printed conductor part burns out. The shunt can also be used as a switching device if it burns out with this current rise and interrupts branch circuit Z1, Z2 . . . . , Zn. Even the connecting wires of power semiconductors FET1, FET2 . . . . , FETn can be dimensioned to assume the function of switching devices FUSE1, FUSE2, . . . . , FUSEn. The electric heater of this type may be designed as a heater module, the power semiconductors (collectively shown as layer 1 in cross-sectional FIG. 3) mounted on a cooling body 10, and integrated into a fan regulator; furthermore, the heater module itself need no longer be fused with respect to the vehicle's electrical system. However, it may be necessary to fuse the feeder lines to the heater module.

Figure 2:
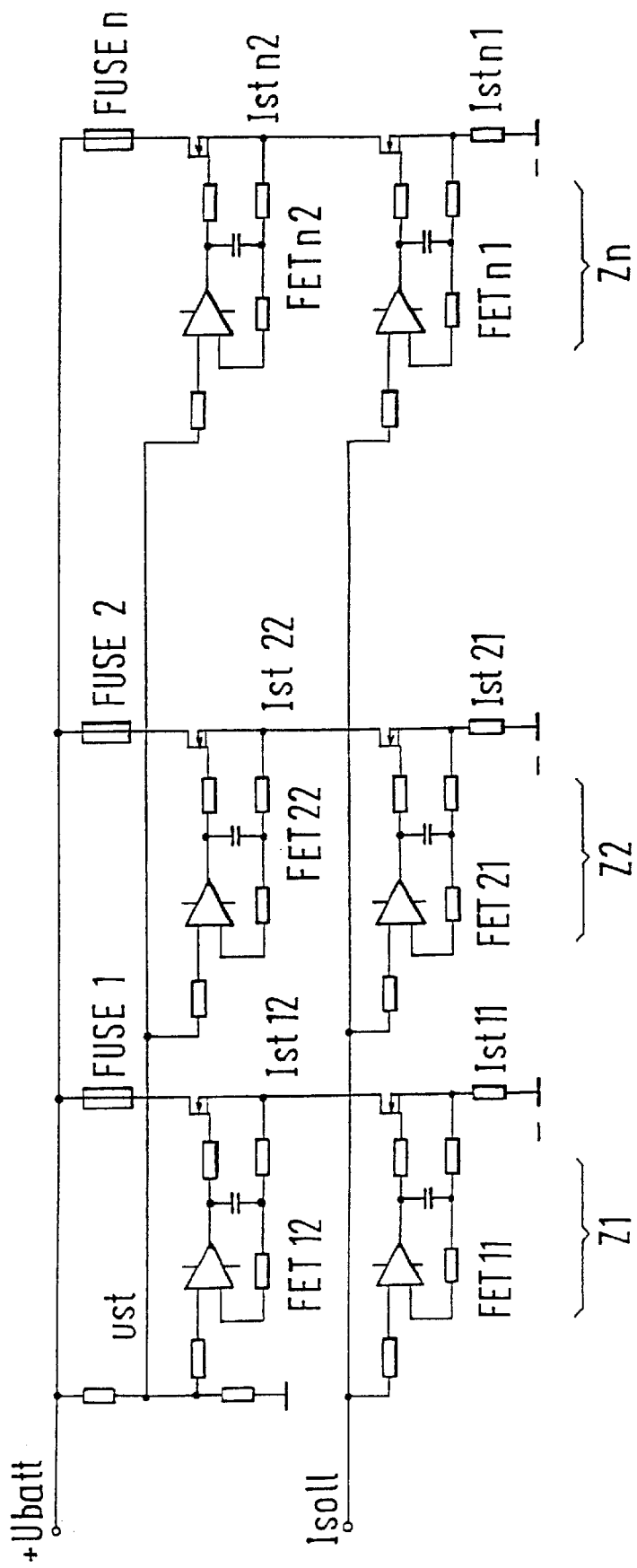
FIG. 2 show a circuit diagram of a second embodiment of the electric heater with n parallel branch circuits, each having two series-connected power semiconductors.

In the embodiment shown in FIG. 2, each branch circuit Z1, Z2, . . . , Zn has two series-connected power semiconductors FET11 and FET12, FET21 and FET22, . . . FETn1 and FETn2, each controlled by its own circuit regulator. As in the embodiment according to FIG. 1, a switching device FUSE1, FUSE2, . . . , FUSEn and a shunt can be looped into branch circuits Z1, Z2, . . . , Zn. Switching devices FUSE1, FUSE2, . . . , FUSEn in turn can be designed in the variants described. Control signals characterizing actual value Ist11, Ist21, . . . Istn1 of branch circuit Z1, Z2, . . . , Zn can be picked off at the shunts of the branch circuits and sent to the circuit regulators of the respective first power semiconductors FET11, FET21, . . . , FETn1 to which can also be sent a setpoint Isoll to regulate the power in branch circuit Z1, Z2, . . . , Zn. The second power semiconductors FET12, FET22, . . . , FETn2 are controlled by separate circuit regulators to which are sent a fixed predetermined control voltage ust and an actual value Ist12, Ist22, . . . , Istn2, which is derived from the voltage drop at the first upstream power semiconductor FET11, FET21, . . . , FETn1. In the event of a short circuit or defect in a power semiconductor such as FET11 with this design of the circuit regulators, the respective second power semiconductor, such as FET12, in branch circuit Z1 can be shut down or the power output by it can be reduced. However, the functioning of the remaining system is not affected, and the heating power is merely reduced by the ratio of defective branch circuits to total branch circuits.

If both power semiconductors, e.g., FET21 and FET22, are short-circuited, then the switching device, e.g., FUSE2 as in the embodiment shown in FIG. 1, goes into operation and interrupts the branch circuit, e.g., Z2, at the high current rise occurring.

If only one common heat-dissipating, low-resistance series resistor is used as the load impedance for all branch circuits Z1, Z2, . . . , Zn to increase the heating power, then this resistor is looped into the common line leading to battery voltage Ubatt. This series resistor does not change the operation of the electric heater, it merely limits the current rise to a lower level in the event of a short circuit in a single power semiconductor (FIG. 1) or both power semiconductors (FIG. 2), but this lower level is still sufficient for a reliable response of switching device FUSE1, FUSE2, . . . , FUSEn. The heat generated by the series resistor is also used for heating, but it entails a power distribution which can be utilized at a predetermined maximum heating power to expand the temperature use range for the heater.

Each power semiconductor or each pair of power semiconductors can also be connected to battery voltage Ubatt across an individual series resistor. Groups of branch circuits may also supply a series resistor. In any case, all the series resistors are involved in the production of heat.

Temperature monitoring can easily be incorporated into the new heater. Thus, a temperature sensor may be provided for each power semiconductor and may also be integrated into the power semiconductor. If a predetermined maximum temperature is exceeded at the power semiconductor, the output signal of the temperature sensor then controls the respective power semiconductor so that its power output is reduced or it is completely shut down.

It is also possible to provide just one temperature sensor for measuring the temperature of the cooling body, with all the power semiconductors of the electric heater being in thermal contact with it. If the temperature of the cooling body 10 exceeds a predetermined maximum temperature, then all the power semiconductors are controlled with the output signal of the temperature sensor in such a way that their power output is reduced or they are completely shut down. Different values of the output signal of the temperature sensor can be used for this purpose, with the output signal initially triggering a power reduction at the first lower value and a complete shutdown at the second higher value of the output signal.

What is claimed is:

1. An electric heater for a motor vehicle, comprising:
   a plurality of branch circuits, each of the branch circuits including a respective power semiconductor which operates in a high power loss operation, the branch circuits being connected in parallel for generating heat, the heat being generated by the respective power semiconductor of each of the branch circuits as a heat source for the electric heater, wherein each of the power semiconductors generates a respective power output, and wherein each of the power outputs is regulated using a common predetermined setpoint value and an actual value of a current flowing in a respective one of the branch circuits.

2. An electric heater, for a motor vehicle, comprising:
   a plurality of branch circuits, each of the branch circuits including a respective power semiconductor which operates in a high power loss operation, the branch circuits being connected in parallel for generating heat, the heat being generated by the respective power semiconductor of each of the branch circuits as a heat source for the electric heater; and switching devices, each of the switching devices responding to an overload and connected in series to the respective power semiconductor in a corresponding branch circuit of the branch circuits;

wherein each of a first set of the power semiconductors generates a respective first power output, each of the first respective power outputs being controllable using a common predetermined setpoint value and respective actual value of a current flowing in a respective one of the branch circuits, and wherein each of a second set of the power semiconductors generates a respective second power output, each of the respective powers output being controllable using a fixed predetermined control voltage and respective actual values of a further current flowing in a respective one of the branch circuits.

3. An electric heater for a motor vehicle, comprising:

a plurality of branch circuits, each of the branch circuits including a respective power semiconductor which operates in a high power loss operation, the branch circuits being connected in parallel for generating heat, the heat being generated by the respective power semiconductor of each of the branch circuits as a heat source for the electric heater, wherein each of the branch circuits includes a low-resistance series resistor and an output for supplying power to the low-resistance series resistor as a load impedance.

4. An electric heater for a motor vehicle, comprising:

a plurality of branch circuits, each of the branch circuits including a respective power semiconductor which operates in a high power loss operation, the branch circuits being connected in parallel for generating heat, the heat being generated by the respective power semiconductor of each of the branch circuits as a heat source for the electric heater, wherein each of the switching devices is designed as a printed conductor part, the printed conductor part burning out if an elevated current flows in the respective one of the branch circuits, the elevated current being indicative of a fault.

5. An electric heater for a motor vehicle, comprising:

a plurality of branch circuits, each of the branch circuits including a respective power semiconductor which operates in a high power loss operation, the branch circuits being connected in parallel for generating heat, the heat being generated by the respective power semiconductor of each of the branch circuits as a heat source for the electric heater, wherein the switching devices are looped as shunts into the branch circuits, the branch circuits burning out if an elevated current flows in a respective one of the branch circuits, the elevated current being indicative of a fault.

6. An electric heater for a motor vehicle, comprising a plurality of branch circuits, each of the branch circuits including a respective power semiconductor which operates in a high power loss operation, the branch circuits being connected in parallel for generating heat, the heat being generated by the respective power semiconductor of each of the branch circuits as a heat source for the electric heater, wherein the power semiconductors include connecting wires, the connecting wires being utilized as switching devices which burn out if an elevated current flows in a respective one of the branch circuits, the elevated current being indicative of a fault.

7. An electric heater for a motor vehicle, comprising:

a plurality of branch circuits. each of the branch circuits including a respective power semiconductor which operates in a high power loss operation, the branch circuits being connected in parallel for generating heat, the heat being generated by the respective power semiconductor of each of the branch circuits as a heat source for the electric heater; and switching devices, each of the switching devices responding to an overload and connected in series to the respective power semiconductor in a corresponding branch circuit of the branch circuits;

wherein, if a short circuit occurs in a first respective semiconductor of the power semiconductors which are connected in series in a respective defective branch circuit of the branch circuits, the respective defective branch circuit generating a control signal, the control signal one of reducing a power output which is generated by a second respective semiconductor of the power semiconductors and switching a status of the second respective semiconductor to a disconnect status.

8. An electric heater for a motor vehicle, comprising:

a plurality of branch circuits, each of the branch circuits including a respective power semiconductor which operates in a high power loss operation, the branch circuits being connected in parallel for generating heat, the heat being generated by the respective power semiconductor of each of the branch circuits as a heat source for the electric heater, wherein the electric heater is a heater module which includes a cooling body, and wherein the power semiconductors are mounted, via a thermal contact, on the cooling body.

9. The electric heater according to claim 8, further comprising:

temperature sensors monitoring at least one of the power semiconductors and the cooling body to detect whether a predetermined maximum temperature threshold is exceeded, the temperature sensors generating output signals, wherein the output signal of a particular sensor of the temperature sensors at least one of:

reduces a power output of one of a respective semiconductor of the power semiconductors and all of the power semiconductors, and switches a status of the power semiconductors to a disconnect status.

10. The electric heater according to claim 9, wherein the temperature sensors are integrated into the power semiconductors.

11. An electric heater for a motor vehicle, comprising:

a plurality of branch circuits, each of the branch circuits including a respective pair of serially-connected power semiconductors which operate in a high power loss operation, the branch circuits being connected in parallel for generating heat, the heat being generated by the respective pair of power semiconductors of each of the branch circuits as a heat source for the electric heater.

12. The electric heater according to claim 11, further comprising:

switching devices, each of the switching devices responding to an overload and connected in series to the respective pair of power semiconductors in a corresponding branch circuit of the branch circuits.

13. The electric heater according to claim 12, wherein each of the pairs of power semiconductors generates a respective power output, and wherein each of the respective power outputs is regulated using a common predetermined setpoint value and an actual value of a current flowing in a respective one of the branch circuits.

14. The electric heater according to claim 11, wherein a first one of the respective pair of power semiconductors generates a respective first power output, each of the first respective power outputs being controllable using a common predetermined setpoint value and respective actual value of a current flowing in a respective one of the branch circuits, and wherein a second one of the respective pair of power semiconductors generates a respective second power output, each of the respective powers output being controllable using a fixed predetermined control voltage and respective actual values of a further current flowing in a respective one of the branch circuits.

15. The electric heater according to claim 11, wherein the power semiconductors are interruptible in response a short circuit.

16. The electric heater according to claim 11, wherein each of the branch circuits includes a low-resistance series resistor and an output for supplying power to the low-resistance series resistor as a load impedance.

17. The electric heater according to claim 11, wherein each of the switching devices is designed as a printed conductor part, the printed conductor part burning out if an elevated current flows in the respective one of the branch circuits, the elevated current being indicative of a fault.

18. The electric heater according to claim 11, wherein the switching devices are looped as shunts into the branch circuits, the branch circuits burning out if an elevated current flows in a respective one of the branch circuits, the elevated current being indicative of a fault.

19. The electric heater according to claim 11, wherein the power semiconductors include connecting wires, the connecting wires being utilized as switching devices which burn out if an elevated current flows in a respective one of the branch circuits, the elevated current being indicative of a fault.

20. The electric heater according to claim 11, wherein, if a short circuit occurs in a first semiconductor of the respective pair of power semiconductors connected in series in a respective defective branch circuit of the branch circuits, the respective defective branch circuit generating a control signal, the control signal one of reducing a power output which is generated by a second semiconductor of the respective pair of power semiconductors and switching a status of the second semiconductor to a disconnect status.

21. The electric heater according to claim 11, wherein the electric heater is a heater module which includes a cooling body, and wherein the power semiconductors are mounted, via a thermal contact, on the cooling body.

22. The electric heater according to claim 21, further comprising:

temperature sensors monitoring at least one of the power semiconductors and the cooling body to detect whether a predetermined maximum temperature threshold is exceeded, the temperature sensors generating output signals, wherein the output signal of a particular sensor of the temperature sensors at least one of:

reduces a power output of one of a respective semiconductor of the power semiconductors and all of the power semiconductors, and switches a status of the power semiconductors to a disconnect status.

23. The electric heater according to claim 22, wherein the temperature sensors are integrated into the power semiconductors.

* * * * *